(12) United States Patent
Ahsanullah

(10) Patent No.: US 6,448,807 B1
(45) Date of Patent: Sep. 10, 2002

(54) DYNAMIC IMPEDANCE CONTROLLED DRIVER FOR IMPROVED SLEW RATE AND GLITCH TERMINATION

(75) Inventor: Zahid Ahsanullah, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/819,635

(22) Filed: Mar. 29, 2001

(51) Int. Cl.[7] .............................................. H03K 17/16
(52) U.S. Cl. .............................. 326/30; 326/26; 326/27
(58) Field of Search .............................. 326/30, 26, 27, 326/86, 87

(56) References Cited

U.S. PATENT DOCUMENTS 5,528,166 A * 6/1996 Iikbahar ...................... 326/27
5,898,321 A    4/1999 Likbahar et al. ............... 326/87
5,963,047 A * 10/1999 Kwong et al. ................. 326/27
6,242,942 B1 * 6/2001 Shamarao ..................... 326/27

FOREIGN PATENT DOCUMENTS

WO          WO 99/06845        11/1999

* cited by examiner

*Primary Examiner*—Michael Tokar
*Assistant Examiner*—Anh Q. Tran
(74) *Attorney, Agent, or Firm*—Kenyon & Kenyon

(57) ABSTRACT

A buffer driver, driving signals with edge transitions onto a transmission line is controlled to improve slew rate and glitch termination by controlling the driver to have a low impedance during a period when edge transitions are taking place, and upon cessation of edge transitions, controlling the driver to have a high impedance.

21 Claims, 4 Drawing Sheets

DYNAMIC IMPEDANCE CONTROLLED DRIVER FOR IMPROVED SLEW RATE AND GLITCH TERMINATION

FIELD OF THE INVENTION

Embodiments of the present invention relate to a dynamic impedance controlled driver which gives improved slew rate and glitch termination when driving a signal having edge transmissions over a transmission line.

BACKGROUND OF THE INVENTION

As system performance has increased, associated input and output delays have decreased. Recent high-speed requirements have forced output buffer designers to push buffer driver impedance much lower than the transmission line impedance they are driving in order to meet timings. This is due to the far end receiver requiring the received signal to be driven to required specifications with multiple loads within a single time of flight. Multiple loads often result in parallel transmission lines and reduced transmission line impedance where the transmitted signal energy is shared among each path.

Simultaneous switching noise can propagate from the power supply rails of an aggressor buffer's (the one switching), through a victim buffer (one not switching), and onto its transmission line. As the driver impedance becomes less than the line impedance, the energy transferred onto the transmission line increases.

A need, therefore, exists for an improved termination arrangement reduces or addresses these problems.

DETAILED DESCRIPTION

Embodiments of methods and circuits for providing a dynamic impedance controlled driver are described. In the following description, for purposes of explanation, numerous specific details are set forth to provide a thorough understanding of the present invention. It will be appreciated, however, by one skilled in the art, that the present invention may be practiced without these specific details. In other instances, structures and devices are shown in block diagram form. Furthermore, one skilled in the art can readily appreciate that the specific sequence in which methods are presented and performed are illustrative and it is contemplated that the sequences can be varied and still remain within the spirit and scope of the present invention.

Figure 1:
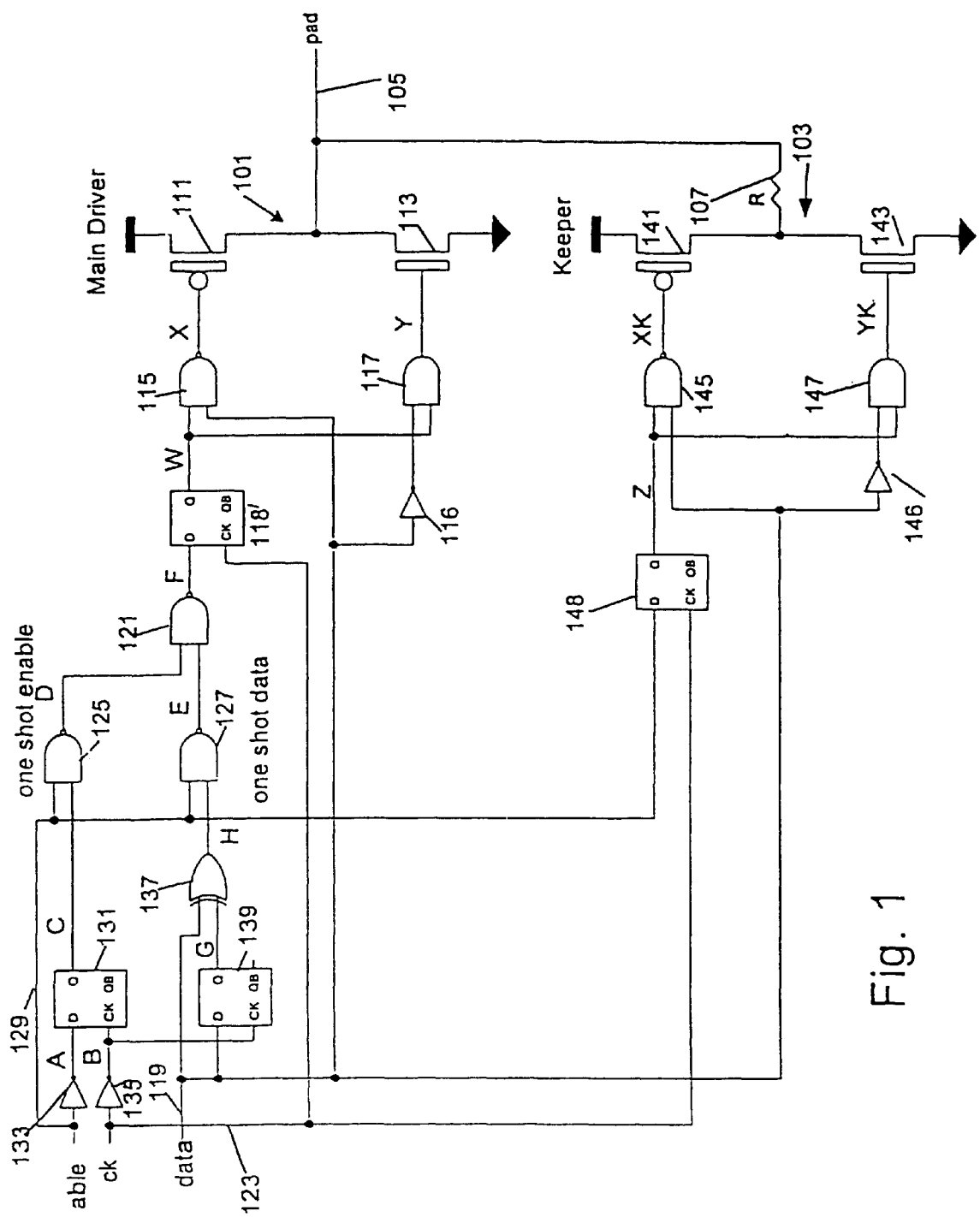
FIG. 1 is a block diagram of a dynamic impedance matched driver circuit in accordance with an embodiment of the present invention.

An embodiment of the output buffer of the present invention is shown in the FIG. 1. There are two drivers 101 and 103 driving a pad 103. Pad 105 is coupled to a transmission line over which the output buffer drives data, for example. The output buffer drives signals with edge transitions which go from a high voltage to a low voltage or vice versa. Driver 101, the main driver is a large buffer that ensures that the timing will be met. For example, the driver may be used to drive an SD)RAM having stringent timing requirements. Although driving an SRAM is used as an example herein, it will be recognized that embodiments of the present invention can be used in any application where it is desired to drive a loads to defined levels in a short period of time while at the same time reducing glitches.

Driver 103 is a small buffer (the keeper). In accordance with one embodiment of the present invention, it may by designed to meet minimum Ioh (maximum output current for a high signal) and Iol (maximum output current for a low signal) specifications. In addition or alternatively, in other embodiments, it may also match the impedance Zo of a board transmission line to which it is coupled. For matching Zo a resistor may be needed between the small buffer 103 and the pad 105 indicated by resistor 107. In some embodiments, resistor 107 may range from 0–100 ohms.

Figure 2:
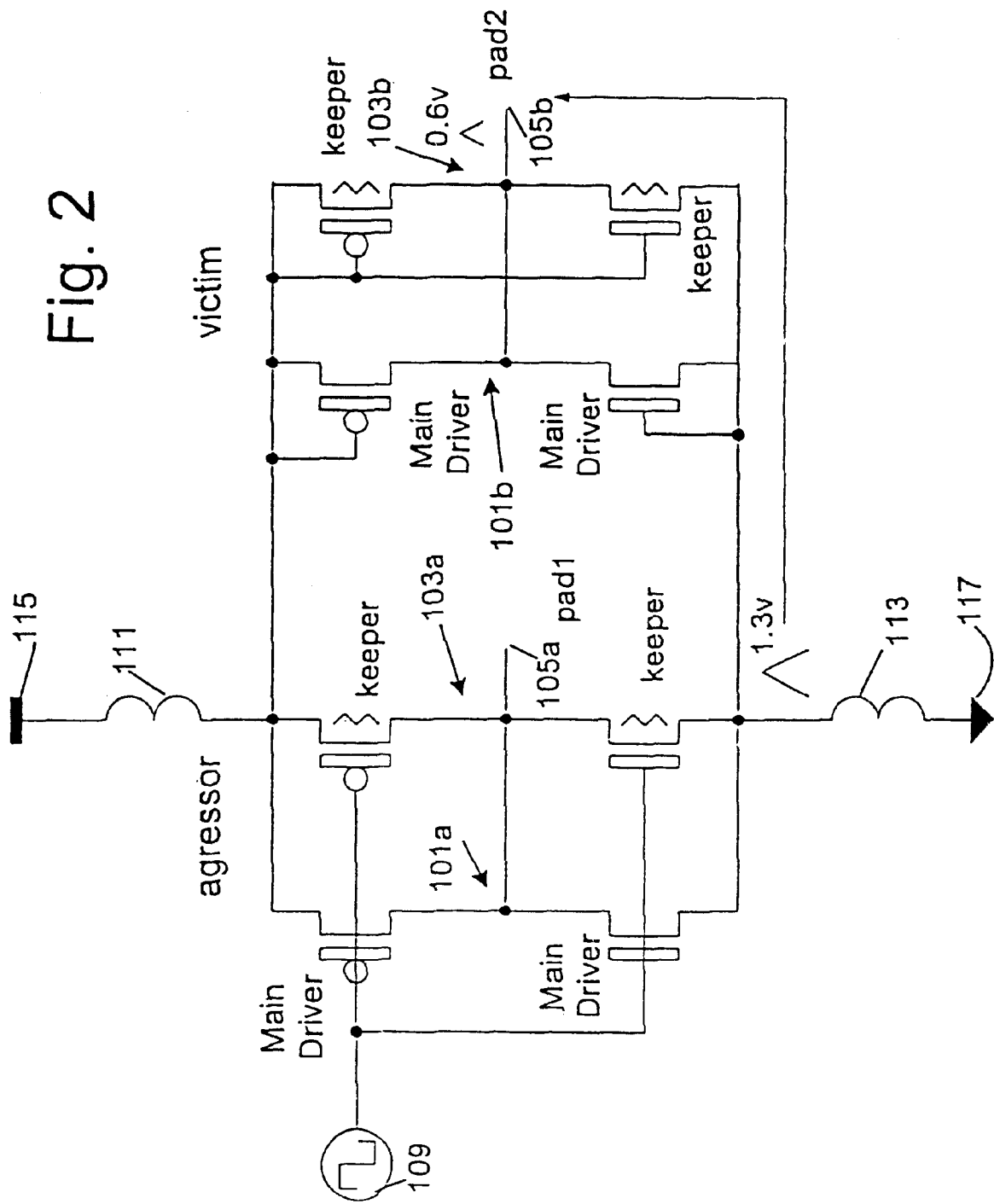
FIG. 2 is a block diagram of two dynamic impedance matched driver circuits in accordance with an embodiment of the present invention illustrating glitch reduction.

The dual buffer/driver offers glitch reduction by providing a high resistance path from supply to pad. This is illustrated by FIG. 2. With the big driver 101 shut off, only the high resistance path of the keeper is available to crosstalk and this reduces the glitch to the pad. Thus, in the example illustrated, the drivers 101a and 103a coupled to pad 105a of FIG. 2 are actively switching as indicated by the input 109. Since these drivers are a source of noise, they are termed the aggressor. These and drivers 101b and 103b, coupled to a pad 105b, are both coupled to the same power supply. These second drivers are not switching and are affected by the noise generated by the first drivers and thus are termed the victim. In accordance with an embodiment of the present invention, when in such a non-switching condition, only the driver 103b is operating; driver 101b has its transistors in a high impedance state.

The two sets of drivers are coupled between Vcc and ground, with inductances 111 and 113 respectively between the power supply terminals 115 and 117 and the positive and negative rails 119 and 121 to which the drivers are coupled. When the main driver couples pad 105a to ground, the voltage on line 121 is, in one embodiment raised by about 1.3 volts. However, this full voltage is not experienced at pad 105b. Were the main driver 101b turned on, most of this voltage would be coupled to pad 105b. But, in the illustrated embodiment, because driver 101b is in a high impedance state, and driver 103b has a high internal resistance, only 0.6 v appears at pad 105b. In other embodiments this value may be more or less. Thus, for the non-transitioning buffer shown in FIG. 2, only the keeper 103b holds the output to the proper logic level and thus has a high resistance. Therefore, there is a high RC time constant path to pad 105b. This reduces the glitch significantly. As noted, an exaggerated ground bounce of 1.3 v on line 121 causes the victim pad 105b to go to 0.6 v only. This is below a typical specification in certain embodiments which limits such glitches to 0.8 v for logic levels.

In addition to glitch reduction, embodiments of the dual buffer design inherently offer improved slew rate since it is possible to differentially turn on the drivers. In accordance with one embodiment of the invention. the small buffer 103 of FIG. 1 is driven first keeping the large one 101 in a high impedance state until the output changes by, for example, 0.5 v. Then the large driver 101 is turned on to make up for lost time and meet specifications of the circuit with which it is being use, e.g., an SDRAM circuit. This creates an overall reduced di/dt current since the output is slowly changed by 0.5 v and then switched hard. Alternatively, it would be possible to switch hard with the big driver 101 from maximum voltage causing maximum di/dt related supply bounce.

Figure 3:
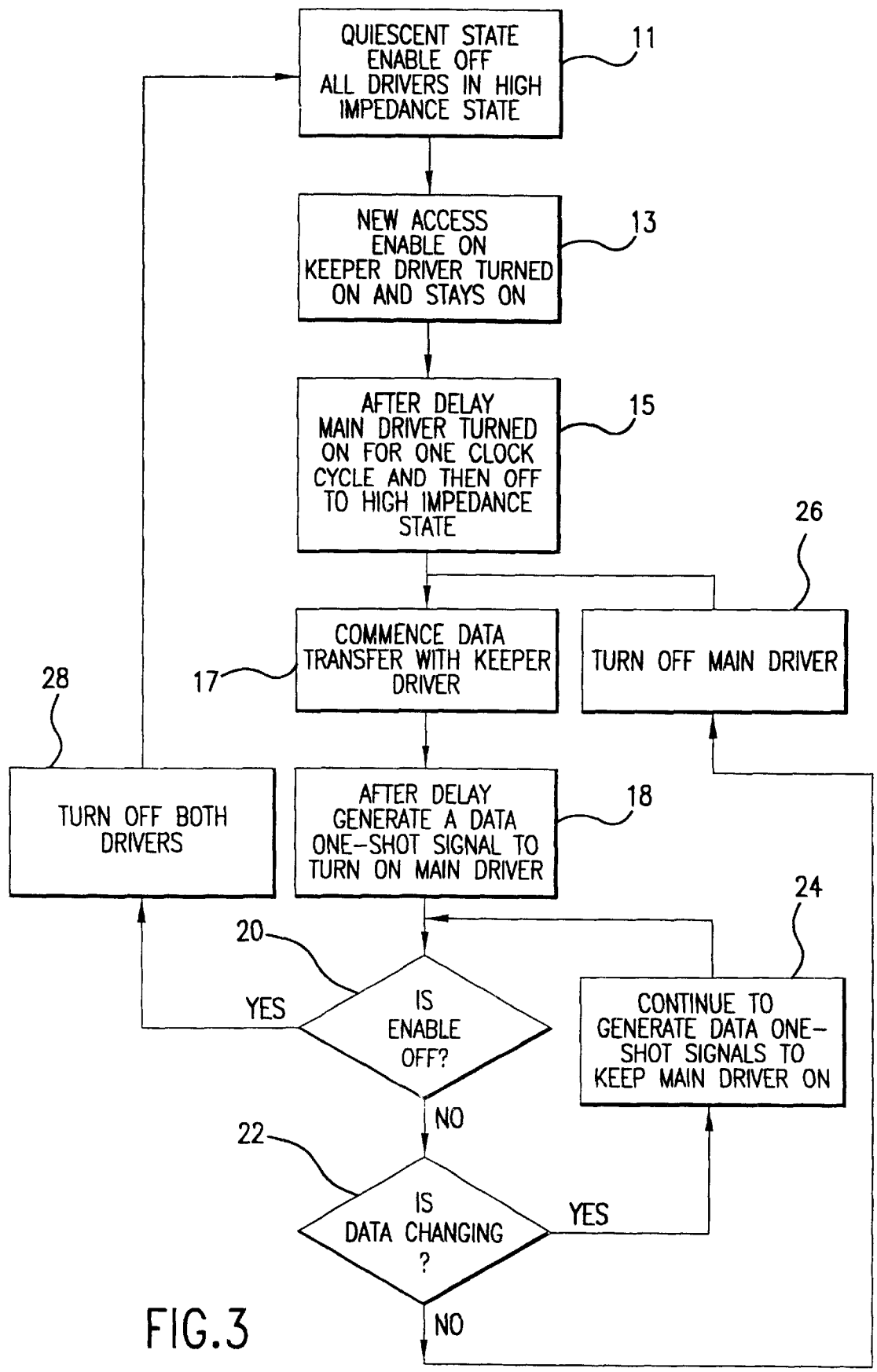
FIG. 3 is a flow diagram of a method of operating a dynamic impedance matched driver circuit in accordance with an embodiment of the present invention.

An embodiment of this method of operation is illustrated by the flow diagram of FIG. 3. The example is for driving an SRAM, but is equally applicable to driving other loads. Initially, as indicated by block 11, the circuit of FIG. 1 is in a quiescent state with both driver 101 and 103 in a high impedance state. Upon the commencement of a new access to the memory (or another similar event signaling that transmission of data is about to commence in another application) an ENABLE signal is turned on. As will be explained in more detail below, this turns on the keeper driver 103 which begins to supply current to the pad 105 being driven as indicated by block 13. After a delay, based on the specific circuit design, e.g., based on analog delays and/or sizing of the transistors in driver 103, the main driver is turned on and kept on for one clock cycle as indicated by block 15. After this one cycle, the keeper 103 stays on, but the main driver 101 returns to the high impedance state in order to provide the glitch reduction noted above.

When the transfer of data commences as indicated by block 17, the first transition begins with on the keeper 103, which was on, driving until, as noted above, the output changes by a predetermined amount. Then, as shown by block 18, the main driver is turned on for one data cycle to provide a high slew rate. A check is made in block 20 to see if the ENABLE signal has been turned off. If it has, both drivers are turned off as described in block 28 and the quiescent state of block 11 is entered. If the ENABLE signal is not turned off, a check is made in block 22 to see if data is changing. If it is, the main driver 101 is kept on for another data cycle. If data is not changing block 26 is entered and the main driver turned off and then block 17 entered to wait for the next data transfer (change in data level). Again, in this state, glitches from other drivers are reduced as explained in connection with FIG. 2.

In accordance embodiments of the present invention, the small buffer 103 is designed first. The smallest transistor sizes meeting Iol and Ioh are chosen and/or a resistance of the buffer equal to Zo is chosen depending on the design goals of the particular embodiment. The size of the larger driver 101 is then selected to be a number of times larger than the small driver 103. In one embodiment, driver 101 can be about six times as large as drive 103. The control circuit that is to switch between the two drivers is then designed. In one embodiment, it will operate to provide the steps described above in connection with FIG. 3. Thus, it may be designed to first turn on the small buffer 103 to limit di/dt. Then after a predetermined time or voltage rise, it must turn on the large driver 101 to meet timing requirements. Then in the absence of further switching, it must turn off the large driver, placing it in the high impedance state.

One such design is the embodiment illustrated in FIG. 1. It will be recognized that this is only one implementation; any circuit implementation which provides the functionality described above regarding turning off the main driver when not transferring data can equally well be used. The design of the illustrated embodiment uses a clocked one-shot circuit that uses an available clock, and an ENABLE signal, e.g., from an SDRAM, to turn on the drivers 101 and 103. When data is about to be transmitted, e.g., on a new access, both drivers 101 and 103 are driven, but a one-shot signal is applied to the big driver 101, while the small driver 103 is continuously driven. The one-shot pulse is equal, for example, to one complete SDRAM clock pulse. This allows enough time for the output to reach the proper logic level. Subsequent burst data transfers with the ENABLE already high are achieved with a one-shot created from the data itself. The old and new data are exclusively Ored (XORed) and with the clock provide the one-shot.

In general terms then, what is required is a first buffer driver to be coupled to a transmission line over which the signal is to be sent and having a first impedance, a second buffer driver coupled in parallel with the first buffer driver having a second impedance, and a buffer enable control to enable both the first and second buffer drivers upon a first edge transition after a period of no transitions and to disable the second buffer driver upon cessation of edge transitions. In the illustrated embodiment, the first buffer driver is driver 103, the second buffer driver is driver 101 and the buffer enable control comprises, in this particular example, the digital logic making up the rest of what is illustrated in FIG. 1.

More specifically, in the exemplary embodiment shown, main driver 101 comprises a PMOS transistor 111 and an NMOS transistor 113 coupled in series between Vcc and ground. The output pad 105 is coupled to the junction between transistors 111 and 113. The gate of transistor 111 is driven by a NAND gate 115 and the gate of transistor 113 by an AND gate 117. The first input to each of gates 115 and 117 is the output of a flip-flop 118. Flip-flop 118 can be considered an enable circuit for driver 101 since it enables the gates 115 and 117 to pass data. The second input to each of gates 115 and 117 is the data input on line 119 (coupled through an inverter 116 to gate 117).

Flip-flop 118 has as a data input the output of a NAND gate 121. Its clock input is from the clock line 123. Gate 121 has as respective inputs the outputs of NAND gates 125 and 127. NAND 125 has as one input the ENABLE signal on line 129. Its second input is from a flip-flop 131. Flip-flop 131 has its data input coupled to ENABLE line 129 through an inverter 133. Its clock input is coupled to clock line 123 through an inverter 135. NAND gate 127 has as two inputs ENABLE line 129 and the output of an exclusive OR (XOR) gate 137. XOR gate 137 receives one input from a flip-flop 139 and the other from data line 119. The combination of inverters 133 and 135, flip-flop 131 and gate 125 form a first one-shot. The combination of flip-flop 139, XOR 137 and gate 127 form a second one shot. The outputs of the two one-shots are effectively Ored in gate 121. As explained in more detail below, gate 121 acts to set flip-flop 118 which enables driver 101.

Keeper driver 101 comprises a PMOS transistor 141 and an NMOS transistor 143 coupled in series between Vcc and ground. The output pad 105 is also coupled to the junction between transistors 141 and 143. The gate of transistor 141 is driven by a NAND gate 145 and the gate of transistor 143 by an AND gate 147. The first input to gate 145 and 147 is the output of a flip-flop 148. Flip-flop 148 can be considered an enable circuit for driver 101. The second input to each of gates 115 and 117 is the data input on line 119 (coupled through an inverter 146 to gate 147). Flip-flop 148 has its data input coupled to enable line 129 and its clock input coupled to clock line 123.

Figure 4:
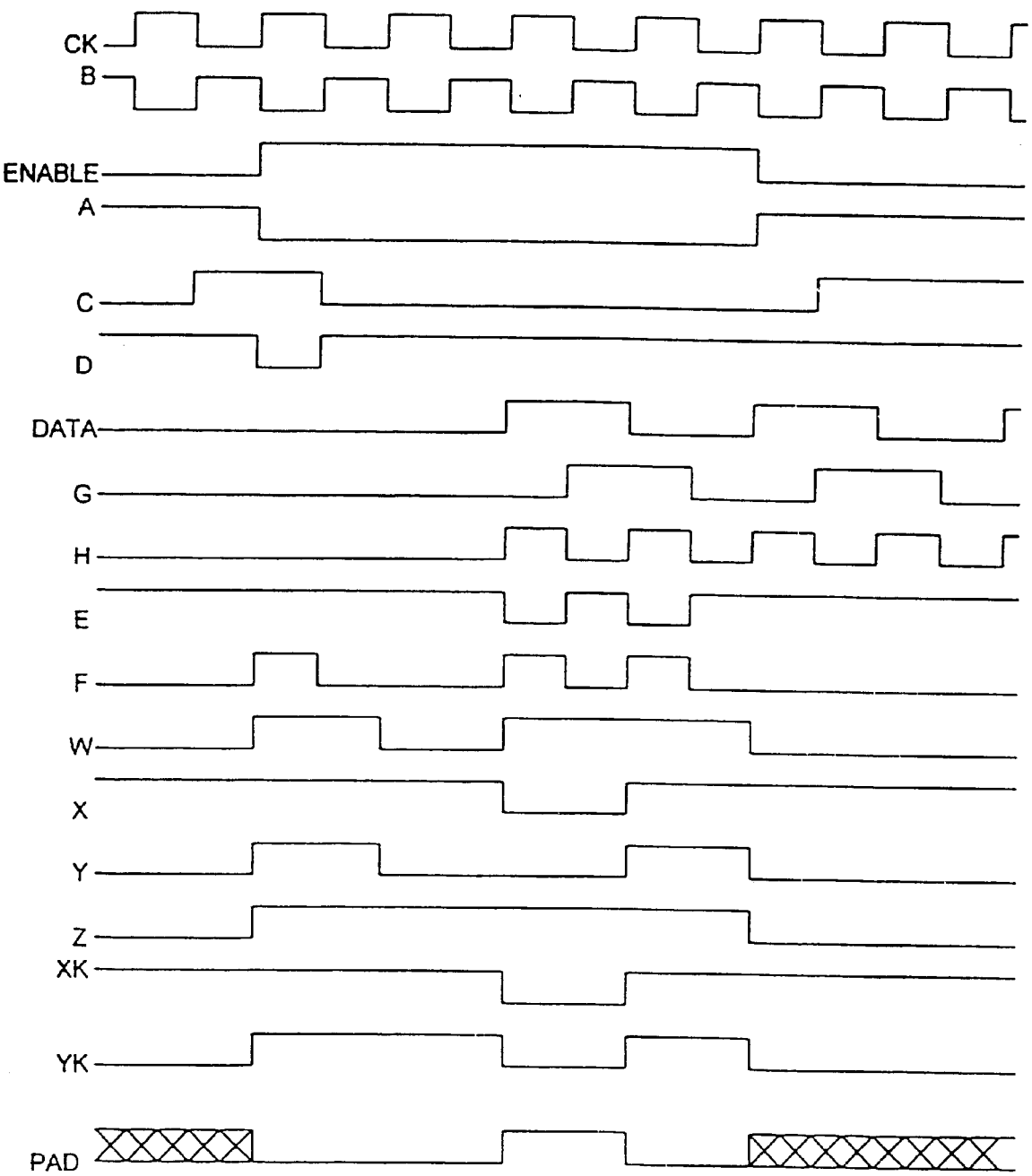
FIG. 4 is a waveform diagram helpful in understanding the operation of the embodiment of FIG. 1.

FIG. 4 is a waveform diagram helpful in understanding the operation of the embodiment of FIG. 1. As described herein a high level and a logic 1 are identical and similarly a low level and a logic 0 are the same. Furthermore, although certain logic functions and conventions are employed, it will be recognized by those skilled in the art that other logic conventions and devices can be employed to reach the same result.

In operation the enable line 129 goes high (a logic 1) to indicate, for example, a new access to memory. On the next clock cycle, this logic 1 is transferred to the output of flip flop 148, shown as waveform Z which stays at that level as long as the ENABLE signal is high. The output of flip-flop 148 enables the gates 145 and 147. Thus, when data is high, the output of gate 145, waveform XK, is low, turning transistor 141 on and bringing pad 105 to the Vcc level. This high data level inverted through inverter 146 appears as a logic 0 at the input to AND gate 147 causing its output, waveform YK to also be logic 0 and turn transistor 143 off.

If data is low, this low, logic 0, level of the data is inverted through inverter 146 to be a logic 1 and AND gate 147 will now have a logic 1 output turning on transistor 143 to switch pad 105 to ground. NAND gate 145 will now have a 0 input and a 1 input, so its output XK will become a 1, to switch transistor 141 off. In this initial condition where the data level is not changing, one of the two transistors will remain on, keeping pad 105 at either Vcc or ground. As long as an ENABLE is present, the driver 103 will be on and when data changes it will follow changes in data. However, as described above in connection with FIG. 2, when data is not changing, only driver 103 is on and it provides a high impedance path to glitches.

At the data input to flip-flop 131, when the ENABLE line is low, inverted through inverter 133 it is high as indicated by waveform A. The clock is also coupled through an inverter 135 and appears as waveform B at the output thereof. On the first falling edge of the clock, which becomes a rising edge on the inverted clock, waveform B, the 1 at the data input appears at the output C of flip-flop 131. NAND gate 125 will have a logic 1 output, shown on waveform D; only when both inputs are logic 1 will it have a 0 output.

When ENABLE first goes to logic 1, there will be two 1s at the input of NAND gate 125 and its output will become a logic 0. The logic 1 level of ENABLE through inverter 133 will appear as a logic 0 at the data input, waveform A, of flip-flop 131. On the first falling edge of the clock after the ENABLE appears, which becomes a rising edge on the inverted clock, waveform B, the 0 at the data input appears at the output of flip-flop 131. The output D of NAND gate 125 will return to a logic 1.

As shown in FIG. 4 data starts out low. Thus, the output G of flip-flop 139 will be a logic 0. Since data is also logic 0, the output H of XOR 137 is also logic 0. With ENABLE at a 0 logic level, NAND gate 127 had two 0 inputs and a 1 output E. Throughout this period, with data at 0, NAND gate 121 will thus have a logic 1 input from gate 127 as an input. Its second input is from the output D of NAND gate 125. Initially, this will be logic 1 resulting in a logic 0 output F for gate 121. A rising clock edge will cause this 0 to appear at the output of flip-flop 118. In this condition, a condition where there is no ENABLE signal and data is not changing, neither gate 115 or 117 is enabled to turn on its corresponding transistor 111 or 113.

When ENABLE goes high, the output D of gate 125 goes low for one half clock cycle. This results in the output F of gate 121 going high for one half clock cycle. This is the data input at flip-flop 118 and will be clocked to its output W where a logic 1 will remain for a full clock cycle. At this point, data is 0 and the output Y of gate 117 will become 1, to switch pad 105 to ground through transistor 113. As explained above, this occurs a short period of time after drive 103 turns on as explained above. At the end of the one clock cycle, Y returns to 0 and the driver 101 goes back to the high impedance state; only driver 103 remains on.

When a data transfer begins and data goes high, the output G of flip-flop 139 remains low for one-half clock cycle (output G is delayed one-half clock cycle from the data signal due to the inverted clock signal driving flip-flop 139) and the output H of XOR 137 is high for one-half clock cycle. This causes output E of gate 127 to go low for one-half cycle and output F of gate 121 to go high for one half cycle. This then results in the output W of flip-flop 118 to go high for a full cycle. However, the inverted data G from flip-flop 139 results in an additional high H output from XOR 137, which through the path just described, causes W to remain at a 1 level. Thus, W remains high for a full data cycle.

While W remains high, when data goes high, the output of gate 115, waveform X, goes low, turning transistor 111 ON to switch Vcc to pad 105. This high data level inverted through inverter 116 appears as a logic 0 at the input to AND gate 117 causing its output, waveform Y to also be logic 0 and turn transistor 113 OFF. When data goes low, this logic 0 level on the data is inverted through inverter 116 to be a logic 1 and the output Y of gate 117 will now be a logic 1, turning transistor 113 ON to switch ground to pad 105. NAND gate 115 will now have a 0 input and a 1 input, so its output waveform X- will become a 1 to transistor 111 OFF.

As long as the ENABLE line stays high, and data is changing, the circuit will retrigger the data one-shot and keep the output W of flip-flop 118 high, in turn keeping the driver 101 turned on. However, once the data stays at one level for more than one data cycle, the driver 101 will be turned off. Of course, as shown on FIG. 4, if ENABLE goes low, both drivers are then turned off.

The dual buffer design described above offers an easy way to control three of the most difficult situations in the design of output buffer namely crosstalk, slew rate control, and transmission line matching. In the embodiment illustrated in FIG. 1, just nine extra minimum sized gates allow making an output buffer to go dual. In one particular implementation, for a 4 mA Ioh and Iol specification, the small buffer 103 offers an impedance of 110 ohms to the pad. If the full buffer operates the resistance is 28 ohms. This offers a significant reduction in crosstalk.

Embodiments of methods and apparatus for a dual buffer have been described. In the foregoing description, for purposes of explanation, numerous specific details are set forth to provide a thorough understanding of the present invention. It will be appreciated, however, by one skilled in the art that the present invention may be practiced without these specific details. In other instances, structures and devices are shown in block diagram form. Furthermore, one skilled in the art can readily appreciate that the specific sequences in which methods are presented and performed are illustrative and it is contemplated that the sequences can be varied and still remain within the spirit and scope of the present invention.

In the foregoing detailed description, apparatus and methods in accordance with embodiments of the present invention have been described with reference to specific exemplary embodiments. Accordingly, the present specification and figures are to be regarded as illustrative rather than restrictive.

What is claimed is:

1. A method of controlling a driver to improve slew rate and glitch termination for a signal having a plurality of edge transitions, which is driven over a transmission line comprising:

a. during the period when the plurality of edge transitions are taking place, controlling the driver to have a low impedance;

b. maintaining the low impedance for as long as edge transitions continue to occur; and c. upon cessation of the plurality of edge transitions, controlling the driver to have a high impedance.

2. The method according to claim 1 wherein the low impedance is an impedance which is less than the impedance of a transmission line to which the driver is coupled.

3. The method according to claim 2 wherein the high impedance is substantially equal to the transmission line impedance.

4. The method according to claim 2 wherein the driver comprises first and second buffer drivers, with the first buffer driver having a first impedance and the second buffer driver having a second impedance, less than said first impedance.

5. The method according to claim 4 wherein the step of controlling the driver to have a low impedance is carried out by enabling both the first and the second buffer drivers and the step of controlling the driver to have high impedance comprises enabling only the first buffer driver.

6. The method according to claim 5 and further including providing an enabling signal and further including disabling both of said first and second drivers when said enable signal is not present.

7. The method according to claim 1 wherein the size of said first buffer driver is substantially equal to one sixth of the second buffer driver.

8. A method of controlling the impedance of a driver to improve slew rate and glitch termination for a signal having a plurality of edge transitions comprising:
   a. enabling a first buffer driver coupled to a transmission line over which the signal is to be sent and having a first impedance, prior to a first edge transition after a period of no transitions;
   b. upon a first edge transition after a period of no transitions enabling a second buffer driver, coupled in parallel with the first buffer driver, and having a second impedance;
   c. maintaining the second buffer driver enabled for as long as edge transitions continue to occur; and
   d. upon cessation of edge transitions, disabling the second buffer driver.

9. The method according to claim 8 wherein said first impedance is higher than said second impedance.

10. A method of controlling the impedance of a driver to improve slew rate and glitch termination for a signal having a edge transitions comprising:
    a. enabling a first buffer driver coupled to a transmission line over which the signal is to be sent and having a first impedance, prior to a first edge transition after a period of no transitions;
    b. enabling a second buffer driver, coupled in parallel with the first buffer driver, and having a second impedance, for one clock cycle upon enablement of said first buffer driver and before a first edge transition.
    c. upon said first edge transition after a period of no transitions enabling said second buffer driver; and
    d. upon cessation of edge transitions, disabling the second buffer driver.

11. The method according to claim 10 wherein said enabling of said second buffer driver further comprises:
    a. upon each data transition, enabling said second buffer for one data cycle.

12. The method according to claim 10 wherein the first impedance is substantially matched to the transmission line.

13. Apparatus to control the impedance of a driver to improve slew rate and glitch termination for a signal having edge transitions comprising:
    a. a first buffer driver to be coupled to a transmission line over which the signal is to be sent and having a first impedance;
    b. a second buffer driver coupled in parallel with the first buffer driver having a second impedance; and
    c. a buffer enable control to enable both the first and second buffer drivers upon a first edge transition after a period of no transitions and to disable the second buffer driver upon cessation of edge transitions,
    d. wherein said buffer enable control has an enable input and is arranged to disable both said first and said second buffer driver when said enable signal is not present; and
    e. wherein said buffer enable control also has an input to receive clock signals and is arranged to, upon assertion of said enable signal, enable said first buffer driver for as long as said enable signal is present and to enable said second buffer driver for one clock cycle.

14. Apparatus according to claim 13 wherein the first impedance is substantially matched to the transmission line.

15. Apparatus according to claim 13 wherein said buffer enable control includes:
    a. a first driver enable circuit coupled to said first buffer driver; and
    b. a second driver enable circuit coupled to said second buffer driver.

16. Apparatus according to claim 15 wherein said buffer enable control further comprises:
    a. an enable input coupled to said first driver enable circuit;
    b. a clock input;
    c. a data input coupled to both said first and second buffer drivers;
    d. a first one shot circuit having inputs coupled to said enable input and said clock input and having an output coupled as a first enable input to said second driver enable circuit;
    e. a second one shot circuit having inputs coupled to said data input and said clock input and having an output coupled as a second enable input to said second driver enable circuit.

17. Apparatus according to claim 16 wherein said first one-shot comprises:
    a. a first flip-flop having a second data input, a second clock input and an output;
    b. a first inverter having an input coupled to said enable input and an output coupled to said data input;
    c. a second inverter having an input coupled to said clock input and an output coupled to said flip-flop clock input;
    d. a first gate having inputs coupled to said enable input and said flip-flop output and an output forming the output of said first one shot.

18. Apparatus according to claim 16 wherein said second one-shot comprises:
    a. a second flip-flop having a third data input, a third clock input and an output;
    b. said third data input coupled to said data input;
    c. said third clock input coupled to the output of said second inverter;
    d. an XOR gate having as inputs, said data inputs and the output of said second flip-flop and having an output;
    e. a second gate having inputs coupled to said enable input and the output of said XOR gate and an output forming the output of said second one shot.

19. Apparatus according to claim 18 and further including a third gate Oring the outputs of said first and second one-shots and having an output coupled to said second driver enable circuit.

20. Apparatus according to claim 19 wherein:
a. said first driver comprises a first PMOS transistor and a first NMOS transistor in series between Vcc and ground, a junction between said transistors coupled to the transmission line;
b. said second driver comprises a second PMOS transistor and a second NMOS transistor in series between Vcc and ground, a junction between said transistors coupled to said transmission line;
c. said first driver enable circuit comprises a third flip-flop; and
d. said second driver enable circuit comprises a fourth flip-flop, and further including:
e. a first PMOS predriver having inputs from the output of said third flip-flop and said data input and an output coupled to said first PMOS transistor;
f. a first NMOS predriver having inputs from the output of said third flip-flop and said data input and an output coupled to said first NMOS transistor;
g. a second PMOS predriver having inputs from the output of said fourth flip-flop and said data input and an output coupled to said second PMOS transistor; and
h. a second NMOS predriver having inputs from the output of said fourth flip-flop and said data input and an output coupled to said second NMOS transistor.

21. Apparatus according to claim 20 wherein said first and second PMOS drivers comprise NAND gates and said first and second NMOS drivers comprise AND gates and further including third and fourth inverters disposed respectively between said data input and inputs of said AND gates.

* * * * *